US008574362B2

(12) United States Patent
Hong et al.

(10) Patent No.: US 8,574,362 B2
(45) Date of Patent: Nov. 5, 2013

(54) METHOD AND APPARATUS FOR MANUFACTURING AN ULTRA LOW DEFECT SEMICONDUCTOR SINGLE CRYSTALLINE INGOT

(75) Inventors: Young-Ho Hong, Seoul (KR);
Hyon-Jong Cho, Gumi-si (KR);
Sung-Young Lee, Gumi-si (KR);
Seung-Ho Shin, Seoul (KR); Hong-Woo Lee, Gumi-si (KR)

(73) Assignee: Siltron, Inc., Gumi (KR)

( * ) Notice: Subject to any disclaimer, the term of this patent is extended or adjusted under 35 U.S.C. 154(b) by 1103 days.

(21) Appl. No.: 12/244,283

(22) Filed: Oct. 2, 2008

(65) Prior Publication Data
US 2009/0090294 A1 Apr. 9, 2009

(30) Foreign Application Priority Data
Oct. 4, 2007 (KR) .................. 10-2007-0099804

(51) Int. Cl.
C30B 11/00 (2006.01)
C30B 15/00 (2006.01)
C30B 21/06 (2006.01)
C30B 27/02 (2006.01)
C30B 28/10 (2006.01)
C30B 30/04 (2006.01)
C30B 19/00 (2006.01)
C30B 17/00 (2006.01)
C30B 21/02 (2006.01)
C30B 28/06 (2006.01)

(52) U.S. Cl.
USPC .................. 117/13; 117/11; 117/34; 117/56; 117/73

(58) Field of Classification Search
USPC ...................... 117/11, 13, 34, 56, 73
See application file for complete search history.

(56) References Cited

U.S. PATENT DOCUMENTS

| 4,734,267 A * | 3/1988 | Kojima .................. 117/208 |
| 6,171,391 B1 * | 1/2001 | Fuerhoff et al. .......... 117/14 |
| 2006/0016387 A1 * | 1/2006 | Yokoyama et al. ........ 117/84 |
| 2007/0151505 A1 * | 7/2007 | Cho .................. 117/13 |

FOREIGN PATENT DOCUMENTS

| EP | 1 347 083 | 9/2003 |
| EP | 1 650 332 | 4/2008 |
| JP | A 2004-137093 | 5/2004 |
| JP | 2005-015290 | 1/2005 |
| JP | A 2005-15296 | 1/2005 |
| JP | A 2006-69803 | 3/2006 |

OTHER PUBLICATIONS

European Search Report issued in related European application No. 08 017 323.0 on Aug. 18, 2010.

* cited by examiner

*Primary Examiner* — James McDonough
(74) *Attorney, Agent, or Firm* — Greer, Burns & Crain, Ltd.

(57) ABSTRACT

The present invention relates to a method for manufacturing an ultra low defect semiconductor single crystalline ingot, which uses a Czochralski process for growing a semiconductor single crystalline ingot through a solid-liquid interface by dipping a seed into a semiconductor melt received in a quartz crucible and slowly pulling up the seed while rotating the seed, wherein a defect-free margin is controlled by increasing or decreasing a heat space on a surface of the semiconductor melt according to change in length of the single crystalline ingot as progress of the single crystalline ingot growth process.

3 Claims, 9 Drawing Sheets (a)

(b)

(a)

(b)

METHOD AND APPARATUS FOR MANUFACTURING AN ULTRA LOW DEFECT SEMICONDUCTOR SINGLE CRYSTALLINE INGOT

TECHNICAL FIELD

The present invention relates to a method and apparatus for manufacturing an ultra low defect semiconductor single crystalline ingot, and in particular, to a method and apparatus for manufacturing an ultra low defect semiconductor single crystalline ingot, in which a temperature gradient is uniform in a radial direction of a single crystalline ingot and a defect-free margin is maintained in a lengthwise direction of a single crystalline ingot.

BACKGROUND

As a semiconductor device process moves toward a finer level, for example a nanometer level, even a crystalline defect having size of several tens of nanometers causes reduction in yield of devices. Accordingly, semiconductor device makers increasingly use a wafer having the controlled crystalline defects as a semiconductor substrate.

However, based on Voronkov's theory, a process margin in the manufacture of a defect-free single crystalline ingot is influenced by a vertical temperature gradient of a radial direction, and thus invariably, the temperature gradient should be large and uniform in a radial direction.

According to Voronkov's theory, as shown in FIG. 1, in the case that a V/G value is larger than a critical value due to high speed growth, a vacancy-rich (V-rich) region is formed, which may be resulted from voids. In the case that a V/G value is smaller than a critical value due to low speed growth, an OSF (Oxidation induced Stacking Fault) region is formed near a crystalline. In the case of lower speed growth, an interstitial-rich (I-rich) region is formed that is resulted from a dislocation loop formed by concentration of interstitial silicon. And, a defect-free region that is neither a V-rich region nor an I-rich region is formed between the V-rich region and the I-rich region. The defect-free region includes a Pv region, or a residual vacancy type defect-free region and a Pi region, or a residual interstitial type defect-free region. In V/G, V indicates a pulling speed of a single crystalline ingot and is a convection term of a point defect in the silicon single crystalline. And, G indicates an axial temperature gradient near an interface of a melt and is a diffusion term of a point defect by the temperature gradient in a crystalline.

Generally, in the manufacture of a single crystalline wafer, a margin of a defect-free region is influenced by a temperature gradient of a radial direction, and thus a difference (ΔG) in G value between a center portion of the single crystalline ingot and an edge portion should be small in order to create a uniform temperature gradient in a radial direction.

Conventionally, to manufacture a single crystalline wafer of high margin of a defect-free region, attempts have been made to design a hot zone (HZ) of a heat shield structure located on a solid-liquid interface in various shapes to control a G value of a single crystalline ingot or to adjust a relative location from a maximum heat generation portion of a heater to a surface of a melt to control the convection of a melt or a heat transmission path. And, studies have been made to improve a parameter such as an argon (Ar) flow ratio, a ratio between seed rotation (SR) speed and crucible rotation (CR) speed or types of an electromagnetic field. The related techniques are disclosed in, for example JP Laid-open Patent Publication Nos. 2005-015296, 2006-069803 and 2004-137093.

However, modification to design of a hot zone needs an additional device, and inevitably results in an increase of volume of an equipment, and in the case that a G value of any one of a center portion and an edge portion of a single crystalline ingot is improved, a G value of the other portion is deteriorated. For example, if a bottom of a heat shield structure is designed to be large or thick, the increased degree of a G value of a center portion is trivial in comparison with the increased degree of a G value of an edge portion. As a result, ΔG value is deteriorated.

On the other hand, in the case that an electromagnetic field is improved, change of the electromagnetic field causes change in type of convection of a melt and consequently may reduce a G value or deteriorate ΔG value. And, it is found that a method for optimizing a parameter such as Ar, pressure or SR/CR ratio has a trivial effect.

As shown in FIG. 2(a), a conventional technique for manufacturing a single crystalline ingot of 12 inch diameter and at least 300 kg or 400 kg weight exhibits a narrow process margin due to reduction in a G value of an edge portion, and when manufacturing an Si wafer, causes a DSOD (Direct Surface Oxide Defect) defect (See FIG. 2(b)) in the shape of a ring at a peripheral portion of the wafer, thereby failing to manufacture a defect-free wafer, in which a defect-free margin is uniformly maintained in a radial direction.

And, as disclosed in JP Laid-open Patent Publication No. 2005-015296, in the case that a location of a heater is controlled according to solidification ratio to ensure a margin, an actual growth of a single crystalline ingot involves a latent heat of solidification and changes in G values at a crystalline and a melt due to change in an amount of Si residual melt caused by solidification, from an initial stage of crystallization to the last stage, so that the balance in thermal equilibrium is changed, and a crucible is moved up to maintain a melt level, thereby changing a heat transmission path from the heater to a solid-liquid interface. As such, there is a limitation in maintaining G/ΔG in the lengthwise direction of a crystalline. And, in the case that a charge size is small, for example a single crystalline ingot is grown to 400 kg or 300 kg or less, a latent heat of solidification is relatively small, and thus a pulling speed should be controlled uniformly from an initial stage of growth to the last stage to maintain a margin uniformly, which may reduce productivity.

As an example of the prior art, FIG. 3 shows that as a G value of an edge portion of a single crystalline ingot reduces at the last stage of a single crystalline ingot growth process, a defect-free margin at the last stage remarkably reduces in comparison with a defect-free margin at an initial stage. As mentioned above, this is mainly resulted from a change of latent heat due to change in a residual melt, and reduction in a G value of an edge portion caused by change in the shape of a melt flow and heat transmission due to a hot zone.

SUMMARY

The present invention is designed to solve the problems of the prior arts. Therefore, it is an object of the present invention to provide a method and apparatus for manufacturing an ultra low defect semiconductor single crystalline ingot that controls a cooling efficiency of a single crystalline ingot according to length of the single crystalline ingot to uniformly maintain or increase a defect-free margin throughout a process and improve a pulling speed.

In order to achieve the object of the present invention, the present invention provides a method for manufacturing an ultra low defect semiconductor single crystalline ingot that uses a Czochralski process for growing a semiconductor single crystalline ingot through a solid-liquid interface by dipping a seed into a semiconductor melt received in a quartz crucible and slowly pulling up the seed while rotating the seed, wherein a defect-free margin is controlled by increasing or decreasing a heat space on a surface of the semiconductor melt according to change in length of the single crystalline ingot as progress of the single crystalline ingot growth process.

Preferably, the heat space may be increased or decreased by differentially changing a melt gap between a bottom of a heat shield structure spaced away from an outer periphery of the single crystalline ingot and the surface of the semiconductor melt according to length of the single crystalline ingot.

Preferably, the melt gap is controlled in the range of 25 mm or less.

Preferably, a pulling speed (V) of the single crystalline ingot is changed to satisfy an equation:

$$V = a + b*L + c*(\Delta Gap) \ (a, b, c\text{: constant}, L\text{: length of a single crystalline ingot}, \Delta Gap\text{: a change amount in a melt gap}).$$

The heat space may be increased or decreased by differentially changing an interval between a heat shield structure spaced away from an outer periphery of the single crystalline ingot and the outer periphery of the single crystalline ingot according to length of the single crystalline ingot.

According to another aspect of the present invention, an apparatus for manufacturing an ultra low defect semiconductor single crystalline ingot that performs a Czochralski process for growing a semiconductor single crystalline ingot through a solid-liquid interface by dipping a seed into a semiconductor melt received in a quartz crucible and slowly pulling up the seed while rotating the seed, includes a heat space control unit for controlling a defect-free margin by increasing or decreasing a heat space on a surface of the semiconductor melt according to change in length of the single crystalline ingot as progress of the single crystalline ingot growth process.

BRIEF DESCRIPTION OF THE DRAWINGS

The present invention will be more fully described in the following detailed description, taken accompanying drawings, however, the description proposed herein is just a preferable example for the purpose of illustrations, not intended to limit the scope of the invention.

DETAILED DESCRIPTION

Hereinafter, preferred embodiments of the present invention will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present invention on the basis of the principle that the inventor is allowed to define terms appropriately for the best explanation. Therefore, the description proposed herein is just a preferable example for the purpose of illustrations only, not intended to limit the scope of the invention, so it should be understood that other equivalents and modifications could be made thereto without departing from the spirit and scope of the invention.

Figure 1:
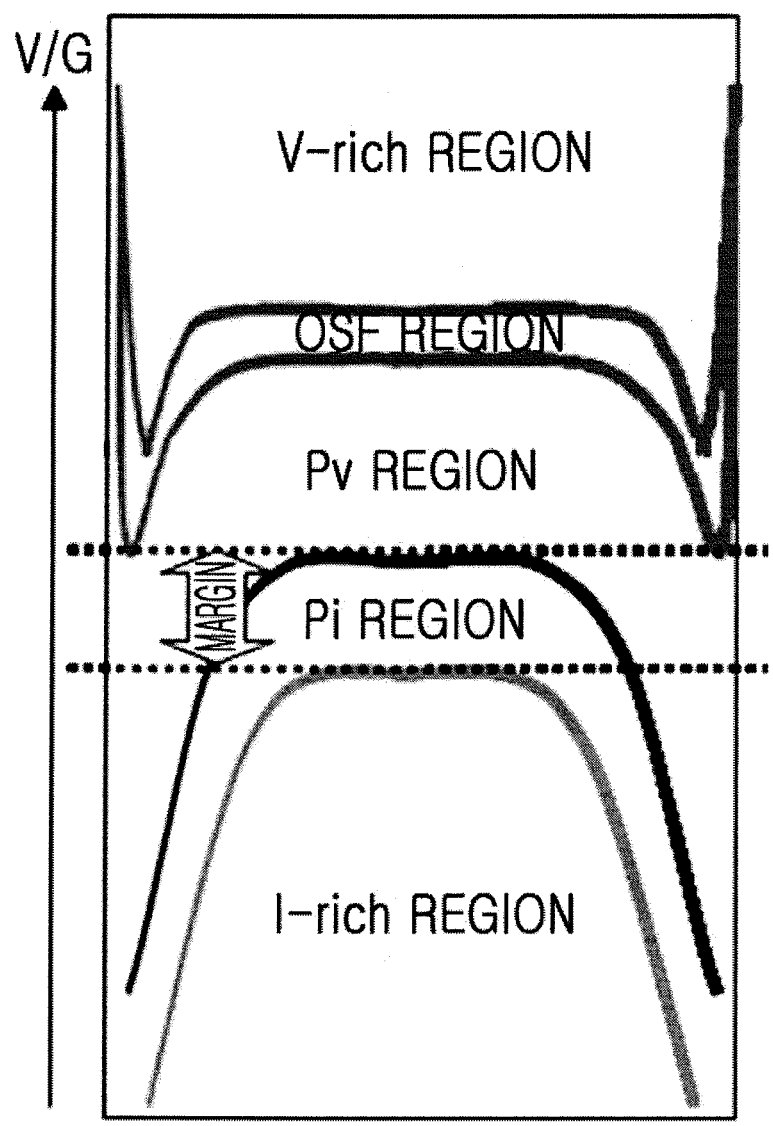
FIG. 1 is a defect distribution diagram showing a vertical defect distribution when growing a silicon single crystalline ingot of 12 inch diameter and 400 kg weight.
Figure 2:
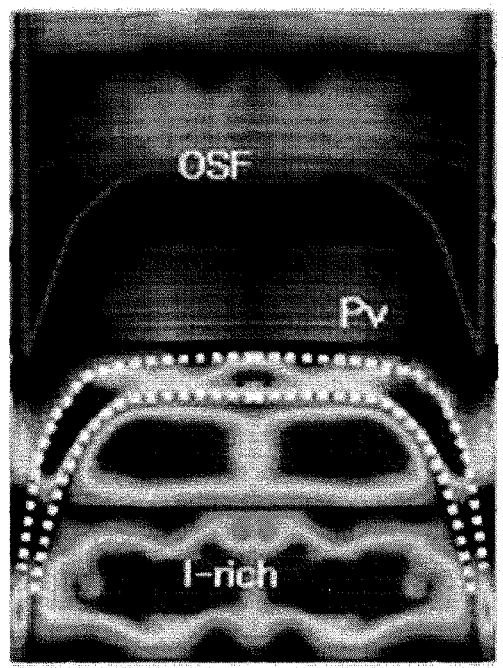
FIG. 2(*a*) is a temperature distribution diagram showing an actual defect distribution of the silicon single crystalline ingot of FIG. 1, and FIG. 2(*b*) is a photograph of a cross section showing an actual defect distribution of the silicon single crystalline ingot of FIG. 1.
Figure 2:
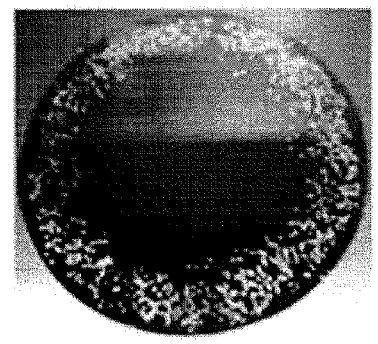
Figure 3:
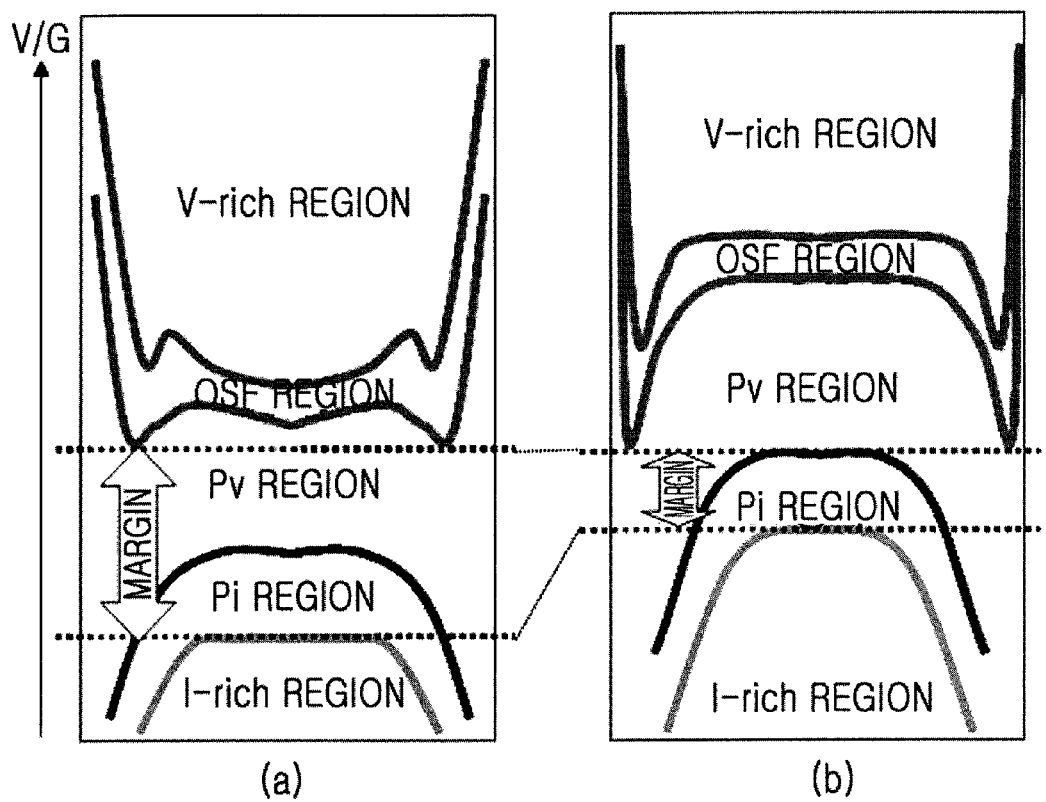
FIG. 3 is a defect distribution diagram showing a change in a defect-free margin by a conventional single crystalline ingot growth process.
Figure 4:
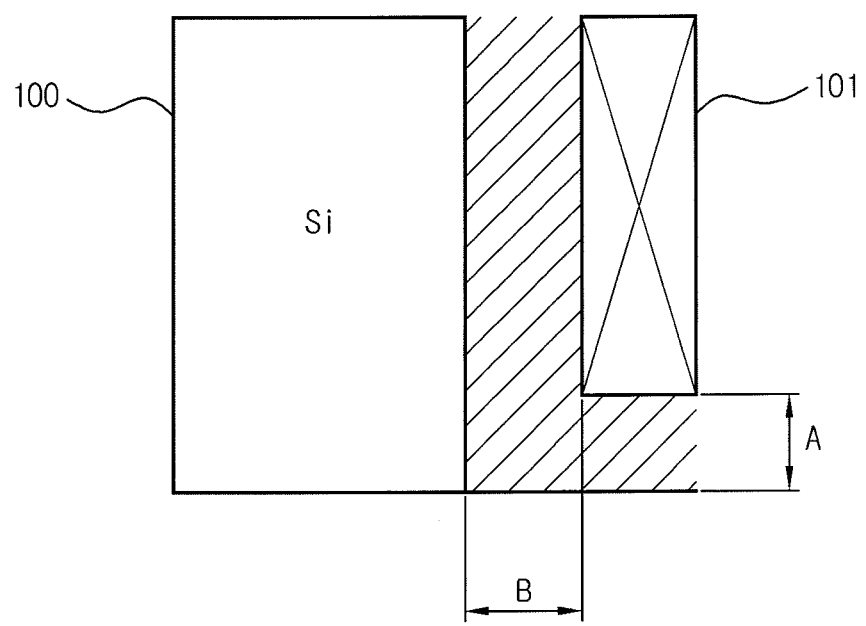
FIG. 4 is a side view showing schematically a heat space on a silicon melt for description of a method for manufacturing an ultra low defect single crystalline ingot according to a preferred embodiment of the present invention.

FIG. 4 is a side view showing schematically a heat space on a silicon melt for description of a method for manufacturing an ultra low defect single crystalline ingot according to a preferred embodiment of the present invention.

The present invention performs a Czochralksi process for growing a silicon single crystalline ingot 100 through a solid-liquid interface by dipping a seed into a silicon melt received in a quartz crucible and pulling up the seed while rotating the seed, and during crystalline ingot growth, controls a heat space (slanted lines) on a surface of a silicon melt or efficiency of the heat space to control a defect-free margin.

The heat space includes a space between an outer periphery of the silicon single crystalline ingot 100 and a heat shield structure 101 and a space between the surface of the silicon melt and a bottom of the heat shield structure 101, and is a space where heat emitted from the silicon single crystalline ingot 100 is accumulated.

Preferably, the heat space is increased or decreased by changing a location of the heat shield structure 101 according to change in length of the silicon single crystalline ingot 100 as progress of a single crystalline ingot growth process. For example, the heat space may be controlled by changing a gap, or a melt gap (A) between the surface of the silicon melt and the bottom of the heat shield structure 101, or an interval (B) between the outer periphery of the silicon single crystalline ingot 100 and the heat shield structure 101, or a combination thereof.

Figure 5:
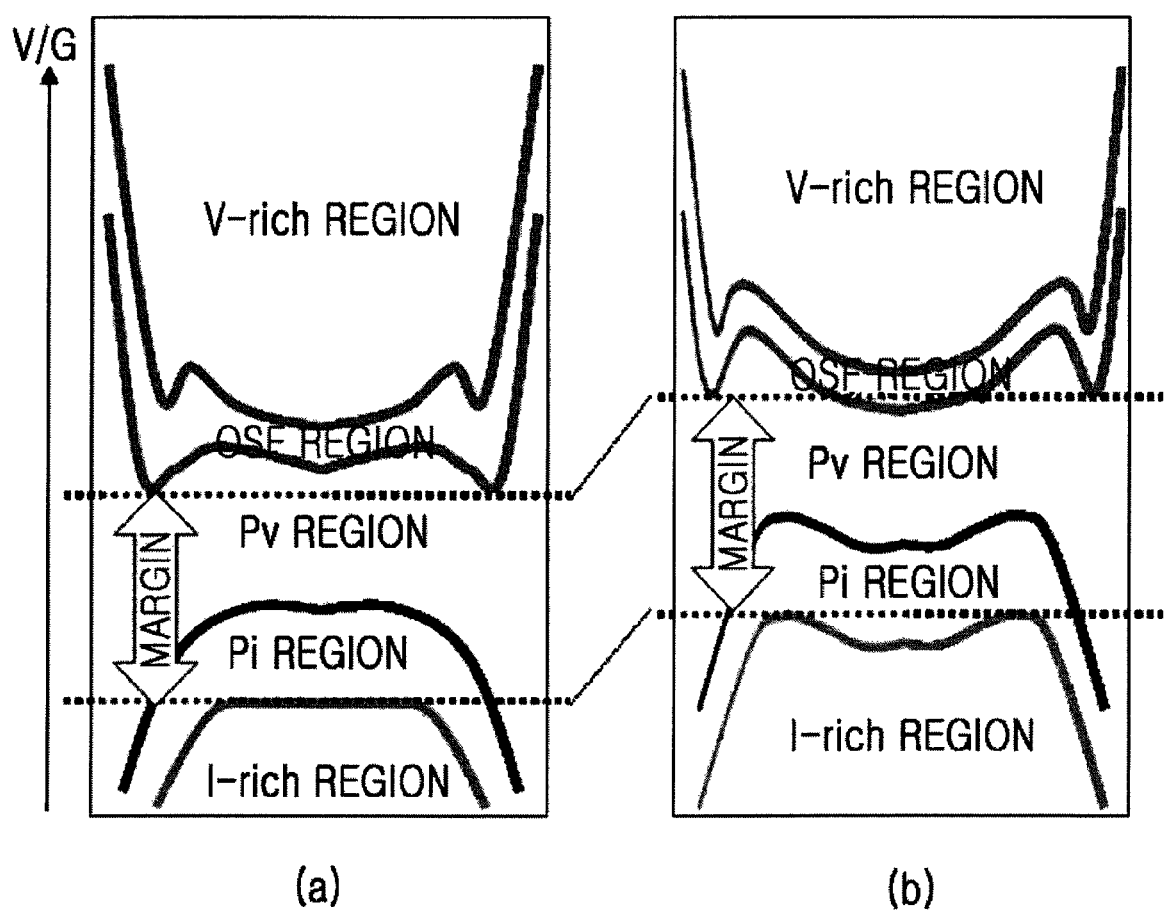
FIG. 5 is a defect distribution diagram showing a defect-free margin maintained uniformly by a method for manufacturing an ultra low defect single crystalline ingot according to a preferred embodiment of the present invention.

The present invention changes a melt gap according to length of a single crystalline ingot during a single crystalline ingot growth process, so a temperature gradient in a radial direction is uniformly maintained from an initial stage of crystalline ingot growth (See FIG. 5(*a*)) to an intermediate stage of crystalline ingot growth and thereafter (See FIG. 5(*b*)). As a result, a defect-free margin can be maintained uniformly, and both of G values of a center portion and an edge portion are increased to improve a pulling speed.

Figure 6:
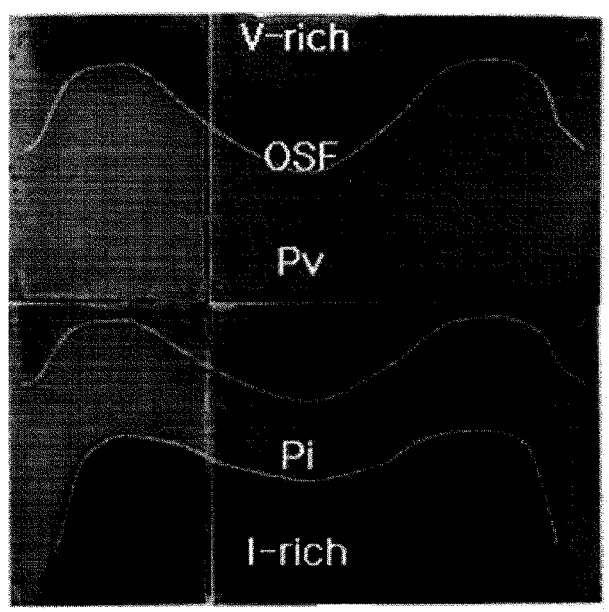
FIG. 6 is a photograph of a cross section showing analysis using a Cu-haze method of an actual defect distribution of a single crystalline ingot manufactured according to a preferred embodiment of the present invention.
Figure 6:
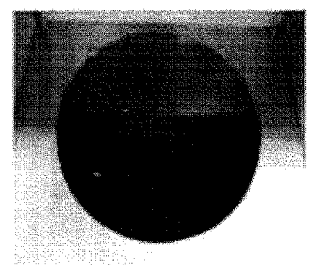

FIG. 6 shows analysis results that a vertical defect distribution of a single crystalline ingot grown according to the present invention is analyzed using a Cu-haze method. Referring to FIG. 6, it is found that a defect-free margin is maintained by a change in a melt gap according to length of the single crystalline ingot, in particular, subsequent to the intermediate stage of crystalline ingot growth, although the pulling speed is changed up to 0.02 mm/min or more, a defect-free margin of the initial stage of crystalline ingot growth is maintained, so that small-size vacancy defects occurred to the edge portion of the single crystalline ingot earlier are improved, and as shown in DSOD (Direct Surface Oxide Defect) measurement results (See FIG. 6(b)), a defect-free region is distributed over the entire surface of a wafer.

Figure 7:
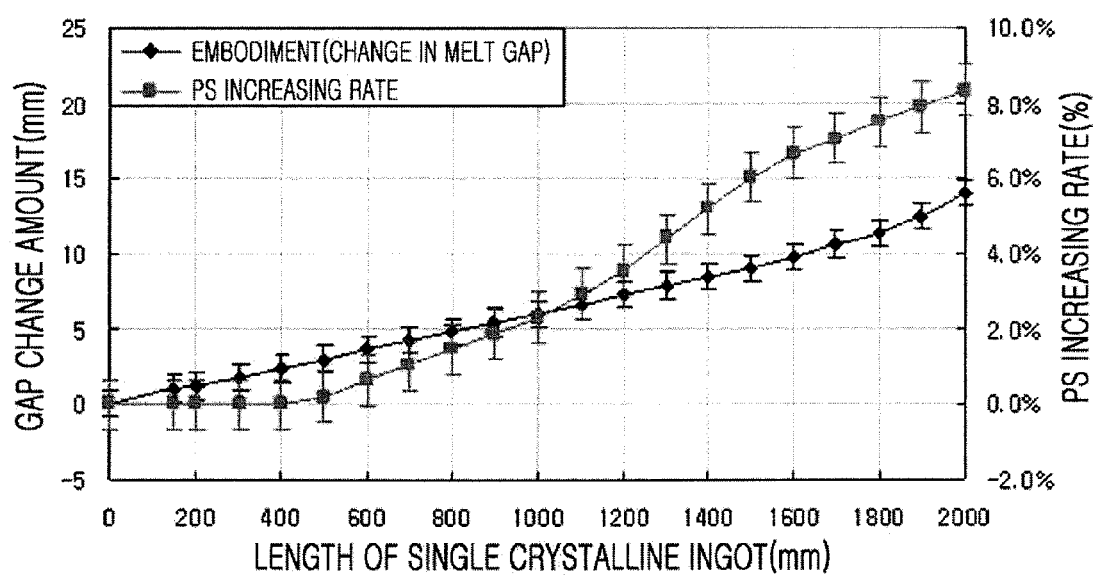
FIG. 7 is a graph showing a change amount of melt gap and an increasing rate of pulling speed according to length of a single crystalline ingot, controlled according to a preferred embodiment of the present invention.

FIG. 7 shows an actual experimental example, in which the heat space is reduced by decreasing a melt gap according to change in length of a growing single crystalline ingot for smooth heat radiation. In the graph, a horizontal axis is a length of a single crystalline ingot changing according to crystalline ingot growth, a left vertical axis is a change (reduction) amount of a melt gap, and a right vertical axis is an increasing rate of pulling speed (PS). Here, the PS increasing rate indicates the percentage of a degree of an improved PS value to a previous PS value.

Referring to FIG. 7, it is found that reduction of the melt gap starts from the initial stage of crystalline ingot growth, and an increasing rate of a pulling speed starts to increase remarkably subsequent to the intermediate stage and further increases toward the last stage. Here, preferably a pulling speed (V) of the single crystalline ingot is set to satisfy the following equation.

$$V = a + b*L + c*(\Delta Gap)$$ ($a,b,c$: constant, $L$: length of a single crystalline ingot, $\Delta Gap$: a change amount of a melt gap) [Equation 1]

Figure 8:
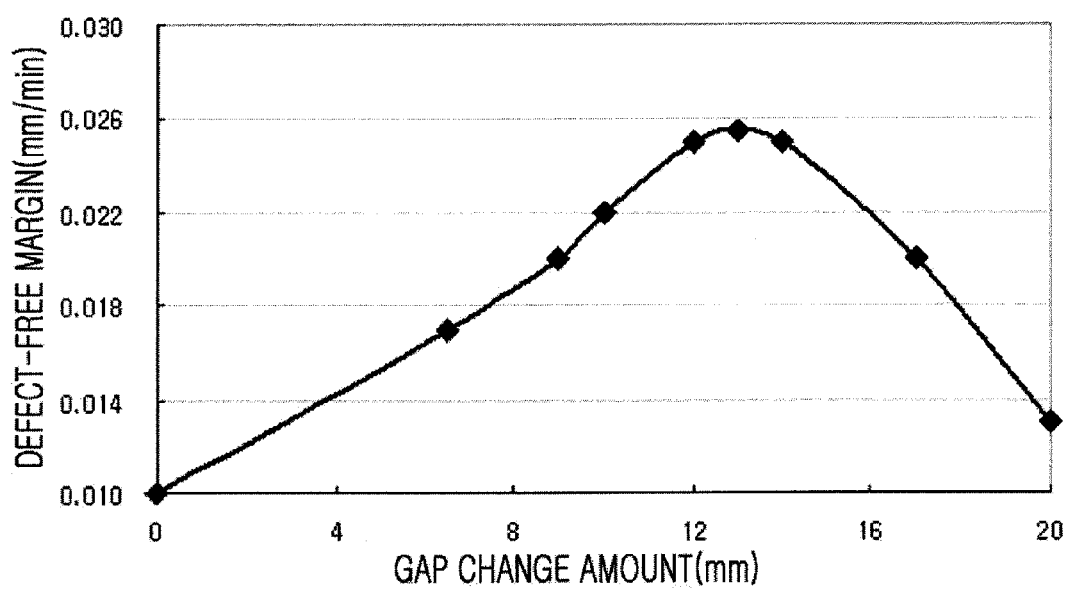
FIG. 8 is a graph showing a change in a defect-free margin according to change in a melt gap.

FIG. 8 is a graph showing an example of a change in a defect-free margin according to level of reduction of a heat space through reduction of a melt gap. It is found that as a melt gap is reduced to 12 to 14 mm, a defect-free margin that was 0.01 mm/min at an initial point, is increased up to 0.025 mm/min or more, and thereafter is reduced. This shows that as reduction in a G value of an edge portion of a single crystalline ingot is improved according to level of a melt gap, a quality margin is improved, but in the case that the G value exceeds a critical value, the excessively increased G value of the edge portion causes a relative reduction of a G value of a center portion of the single crystalline ingot, which is opposite to the conventional phenomenon. Thus, preferably the melt gap is reduced to 12 to 14 mm in the example shown in FIG. 8. As mentioned above, the present invention appropriate controls a heat space to uniformly control a temperature gradient in a radial direction of a single crystalline ingot, so that a sufficient defect-free margin can be secured and a pulling speed can be improved through increase of the entire G value of the single crystalline ingot.

In the present invention, a control pattern of the heat space can be variably changed depending on structure or shape of a heat shield structure. That is, for example, in the case that a space surround by the heat shield structure is relatively narrow, the heat space can be controlled by setting a level of change in a melt gap relatively small. In consideration of structure, shape or size of a general heat shield structure, preferably a level of reduction of the melt gap is set to 25 mm or less as shown in FIG. 7.

And, the heat space can be controlled by slowly increasing a melt gap according to G values of a center portion and an edge portion of a single crystalline ingot and $\Delta G$ level.

Figure 9:
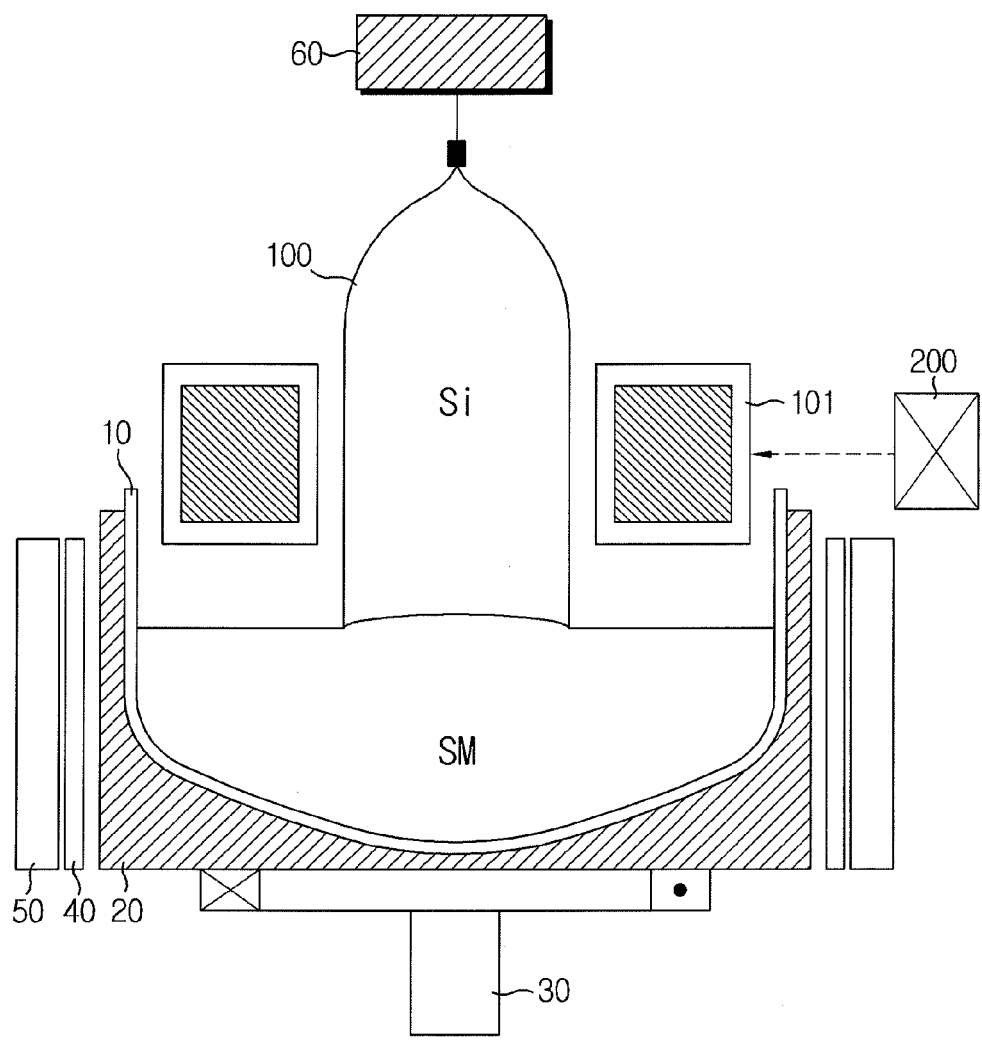
FIG. 9 is a view showing a main configuration of an apparatus for manufacturing a single crystalline ingot according to a preferred embodiment of the present invention.

FIG. 9 is a view showing a main configuration of an apparatus for manufacturing a single crystalline ingot according to a preferred embodiment of the present invention.

Referring to FIG. 9, the manufacturing apparatus includes a quartz crucible 10, a crucible support 20, a quartz crucible rotating means 30, a heating means 40, an adiabatic means 50, a single crystalline ingot pulling means 60, a heat shield structure 101, an inert gas supply means (not shown), and a heat space control unit 200. The quartz crucible 10 receives a silicon melt (SM) that a multicrystalline silicon is melt with high temperature. The crucible support 20 surrounds an outer periphery of the quartz crucible 10, and supports the quartz crucible 10 in a uniform shape at a high temperature atmosphere. The quartz crucible rotating means 30 is installed below the crucible support 20, and rotates the crucible support 20 and the quartz crucible 10 and slowly moves up the quartz crucible 10 in order to uniformly maintain the height of a solid-liquid interface. The heating means 40 is spaced a predetermined distance away from a side wall of the crucible support 20 and heats the quartz crucible 10. The adiabatic means 50 is installed outside of the heating means 40 and prevents heat generated from the heating means 40 from emitting to the external environment. The single crystalline ingot pulling means 60 pulls a silicon single crystalline ingot 100 from the silicon melt (SM) received in the quartz crucible 10 by use of a seed rotating in a predetermined direction. The heat shield structure 101 is spaced a predetermined distance away from an outer periphery of the silicon single crystalline ingot 100 and shields heat emitted from the silicon single crystalline ingot 100. The inert gas supply means (not shown) supplies an inert gas (for example, Ar gas) to an upper surface of the silicon melt (SM) along the outer periphery of the silicon single crystalline ingot 100. The heat space control unit 200 controls a heat space on the silicon melt (SM).

The heat space control unit 200 controls the heat space, for examples, increases or decreases the heat space according to change in length of the single crystalline ingot as progress of a single crystalline ingot growth process. The heat space may be controlled by changing a location of the heat shield structure, however the present invention is not limited in this regard. Although not shown in FIG. 9, the heat space control unit 200 includes a predetermined drive tool and a controller for controlling the drive tool to increase or decrease the heat space by moving the heat shield structure 101.

In the case that the heat space is controlled by changing a location of the heat shield 101, the heat space control unit 200 may perform a drive control to change a melt gap between the surface of the silicon melt (SM) and the heat shield structure 101, or an interval between the outer periphery of the silicon single crystalline ingot and the heat shield structure, or a combination thereof.

Preferably, the heat space control unit 200 decreases the melt gap by moving down the heat shield structure 101 according to change in length of the single crystalline ingot as progress of the single crystalline ingot growth process. At this time, as shown in FIG. 7, the melt gap is preferably controlled in the range of 25 mm or less in consideration of an increasing rate of pulling speed or a defect-free margin.

The apparatus for manufacturing a single crystalline ingot according to the present invention has the same configuration as a typical apparatus for manufacturing a single crystalline ingot using a Czochralisk method known in the art, except the heat space control unit 200, and the detailed description of the same configuration is omitted.

The present invention controls the heat space on the silicon melt to uniformly maintain a temperature gradient in a radial direction ranging from a center portion to an edge portion of the single crystalline ingot, thereby substantially sufficiently securing a defect-free margin from an initial stage of crystalline ingot growth to a last stage of crystalline ingot growth.

According to the present invention, the entire G value according to length of the single crystal increases to improve a pulling speed and consequently increase productivity, and to eliminate the need for change in design of the heat shield structure, thereby reducing the installation costs.

The present invention can be advantageously applicable to, in particular, 12 inch defect-free silicon single crystalline ingot growth. That is, in the case of a 12 inch silicon single crystal manufactured with a large quantity charge of at least 300 kg or 400 kg, a crucible receiving a silicon melt and a heat shield structure surrounding the crucible are increased in size, and consequently an amount of heat accumulated in the heat shield structure is remarkably increased. Further, the convection of the silicon melt is suppressed by a strong electromagnetic field of at least 2000 G or 3000 G applied during the process, thereby suppressing heat emission, so that a G value of the edge portion of the single crystalline ingot is lowered. However, the present invention can solve the above-mentioned problems by decreasing the heat space.

Hereinabove, preferred embodiments of the present invention has been described in detail with reference to the accompanying drawings. However, it should be understood that the detailed description and specific examples, while indicating preferred embodiments of the invention, are given by way of illustration only, since various changes and modifications within the spirit and scope of the invention will become apparent to those skilled in the art from this detailed description.

What is claimed is:

1. A method for manufacturing an ultra low defect semiconductor single crystalline ingot, which uses a Czochralski process for growing a semiconductor single crystalline ingot through a solid-liquid interface by dipping a seed into a semiconductor melt received in a quartz crucible and slowly pulling up the seed while rotating the seed, wherein a defect-free margin is controlled by increasing or decreasing a heat space on a surface of the semiconductor melt according to a change in a length of the single crystalline ingot as a progress of the single crystalline ingot growth process, and the heat space is controlled by differentially changing a melt gap according to the length of the single crystalline ingot by changing a location of a heat shield structure spaced away from an outer periphery of the single crystalline ingot, and by differentially changing an interval between the heat shield structure spaced away from the outer periphery of the single crystalline ingot and the outer periphery of the single crystalline ingot according to the length of the single crystalline ingot.

2. The method for manufacturing an ultra low defect semiconductor single crystalline ingot according to claim 1, wherein the melt gap is controlled in the range of 25 mm or less.

3. The method for manufacturing an ultra low defect semiconductor single crystalline ingot according to claim 1, wherein a pulling speed (V) of the single crystalline ingot is changed to satisfy an equation:

$V=a+b*L+c*(\Delta Gap)$ ($a,b,c$: constant, $L$: length of a single crystalline ingot, $\Delta Gap$: a change amount in a melt gap).

* * * * *